(12) United States Patent
Raynor et al.

(10) Patent No.: US 10,381,760 B2
(45) Date of Patent: Aug. 13, 2019

(54) PRINTED CIRCUIT BOARD EDGE ELECTRICAL CONTACT PADS

(71) Applicant: Hamilton Sundstrand Corporation, Charlotte, NC (US)

(72) Inventors: Damon L. Raynor, Rockford, IL (US); John A. Dickey, Caledonia, IL (US); Alkesh R. Patel, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 15/863,305

(22) Filed: Jan. 5, 2018

(65) Prior Publication Data
US 2019/0214752 A1  Jul. 11, 2019

(51) Int. Cl.
*H01R 12/00* (2006.01)
*H01R 12/72* (2011.01)

(52) U.S. Cl.
CPC .................. *H01R 12/721* (2013.01)

(58) Field of Classification Search
CPC .......................... H01R 13/6273; H01R 12/721; H01R 12/716; H01R 12/7005; H01R 13/635; H01R 13/639; H05K 7/14
See application file for complete search history.

(56) References Cited

U.S. PATENT DOCUMENTS

| 4,499,523 A | 2/1985 | Gillett et al. |
| 4,949,035 A | 8/1990 | Palmer, II |
| 5,506,373 A | 4/1996 | Hoffman |
| 6,071,137 A | 6/2000 | Rutigliano |
| 6,115,242 A * | 9/2000 | Lambrecht ................ G06F 1/20 257/686 |
| 6,253,266 B1 * | 6/2001 | Ohanian .............. H05K 7/1438 361/788 |
| 7,349,221 B2 * | 3/2008 | Yurko .................. H05K 7/1404 165/80.2 |
| 8,270,172 B2 | 9/2012 | Sporer et al. |
| 2009/0233459 A1 | 9/2009 | Shiramizu et al. |
| 2010/0128447 A1 * | 5/2010 | MacDougall ............ G11C 5/04 361/737 |

FOREIGN PATENT DOCUMENTS

EP        0262252 A1    4/1988

OTHER PUBLICATIONS

Extended European Search Report for EP Application No. 19150350.7, dated May 24, 2019, pp. 8.

* cited by examiner

*Primary Examiner* — Xuong M Chung Trans
(74) *Attorney, Agent, or Firm* — Kinney & Lange, P.A.

(57) ABSTRACT

A system includes a first circuit board and a first card guide configured to receive the first circuit board. The first circuit board includes a plurality of first board conductive pads arranged in a first board pattern. The first card guide includes a plurality of first guide conductive pads arranged in a first guide pattern. The plurality of first board conductive pads and the plurality of first guide conductive pads mate to provide signal communication between the first circuit board and the first card guide.

19 Claims, 4 Drawing Sheets

PRINTED CIRCUIT BOARD EDGE ELECTRICAL CONTACT PADS

BACKGROUND

The present invention relates generally to printed circuit boards, and in particular to edge electrical contact pads for circuit boards.

Electrical systems, such as a power distribution system on aircraft, may include several circuit boards connected within a mechanical assembly. For example, secondary power distribution systems my include several circuit boards that control and monitor power distribution within the aircraft. These circuit boards are configured to communicate with each other, as well as other aircraft systems through electrical connectors. The requirement of routing all power and/or data signals to and from the circuit board through the electrical connectors greatly increases the complexity of the system. Further, because the circuit boards often look similar, extra care must be taken to ensure that a circuit board is installed in the correct location, and that each circuit board is installed correctly. It is desirable to reduce the input/output complexity of each circuit board, while also providing an easy, reliable method for verifying proper installation of the circuit board.

SUMMARY

In one example, a system includes a first circuit board and a first card guide configured to receive the first circuit board. The first circuit board includes a plurality of first board conductive pads arranged in a first board pattern. The first card guide includes a plurality of first guide conductive pads arranged in a first guide pattern. The plurality of first board conductive pads and the plurality of first guide conductive pads mate to provide signal communication between the first circuit board and the first card guide.

In another example, a method includes installing a first circuit board into a first card guide. The first circuit board includes a plurality of first board conductive pads arranged in a first board pattern. The first card guide includes a plurality of first guide conductive pads arranged in a first guide pattern. The method further includes verifying proper installation of the first circuit board by verifying that the first board pattern matches the first guide pattern.

In another example, a printed circuit board includes a plurality of board conductive pads arranged in a first pattern. The printed circuit board is configured to be received by a first card guide. The first card guide includes a plurality of first guide conductive pads arranged in the first pattern. The printed circuit board is configured to transmit and receive signals to and from the first card guide through the plurality of board conductive pads.

DETAILED DESCRIPTION

Printed circuit boards (PCBs) are disclosed herein that include conductive pads for signal communication. A PCB is installed within an assembly that includes card guides. Card guides are configured to receive, and hold, respective PCBs in place. The card guides also include conductive pads that are configured to mate with the conductive pads of the PCB. The mated conductive pads facilitate signal communication between the PCB and the respective card guide, reducing the number of signals that must be routed through PCB connectors. The PCB conductive pads may be arranged on the circuit board in a unique pattern that matches the pattern of conductive pads on a respective card guide. This way, the conductive pads may be used to verify correct installation location for the PCB while also reducing the number of signals that must be routed through PCB connectors.

Figure 1:
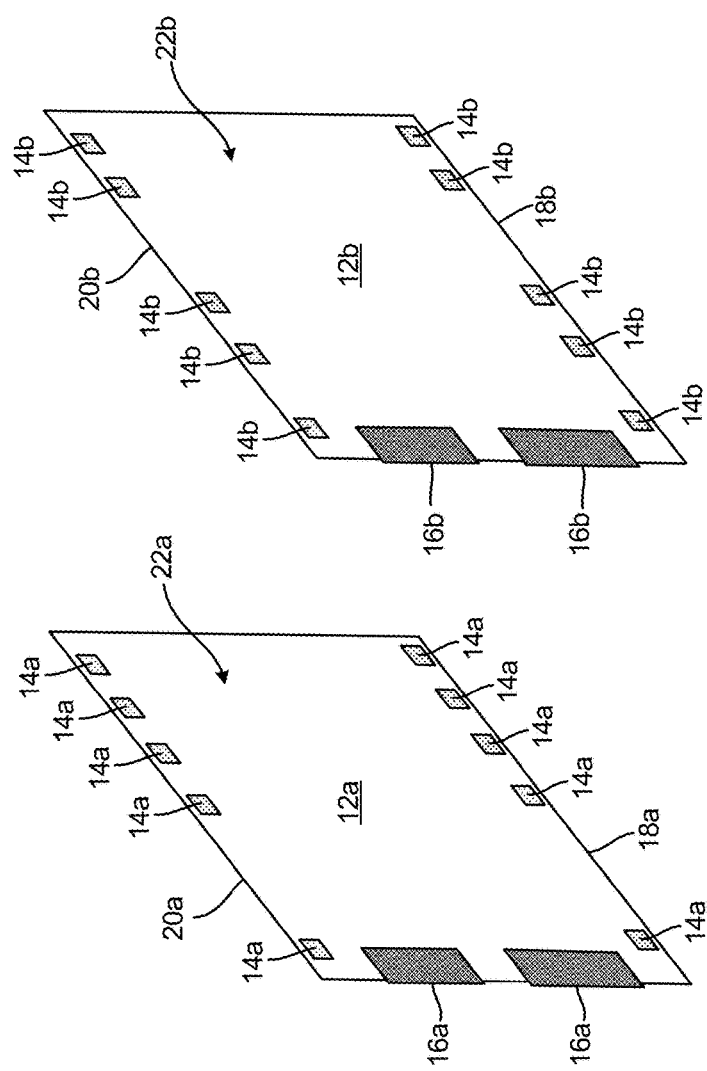
FIG. 1 is a diagram illustrating printed circuit boards that include conductive pads for signal communication.

FIG. 1 is a diagram illustrating printed circuit boards (PCBs) 12a and 12b that include respective conductive pads 14a and 14b for signal communication. PCBs 12a and 12b are mechanical boards that include various electronic components. PCBs 12a and 12b may be single layer or multiple layer circuit boards. Aside from conductive pads 14a and 14b, the remaining electronics implemented by PCBs 12a and 12b are not illustrated in FIG. 1 for simplicity, but PCBs 12a and 12b may include hundreds of electronic components on either side of PCB 12a and 12b. PCBs 12a and 12b may include respective input/output (TO) connectors 16a and 16b, which may be pinned electrical connectors, or any other type of connector capable of communicating electrical signals to and from the electronic components of PCBs 12a and 12b.

Conductive pads 14a are located proximate edges 18a and 20a, on first side 22a of PCB 12a. Conductive pads 14b are located proximate edges 18b and 20b, on first side 22b of PBC 12b. Conductive pads 14a and 14b may be configured to communicate IO signals in addition to the signals communicated through connectors 16a and 16b. Thus, conductive pads 14a and 14b may supplement, and/or eliminate the need for connectors 16a and 16b. While illustrated at edges 18a and 20a, conductive pads 14a may be located at any location on PCB 12a that allows mating with a conductive pad implemented by the assembly within which PCB 12a is installed. Conductive pads 14b may also be located at any location on PCB 12b that allows mating with a conductive pad implemented by the assembly within which PCB 12b is installed.

Additionally, preventing generation of electromagnetic interference (EMI) due to crosstalk between some of the signals communicated to and from PCBs 12a and 12b has been a concern for prior art PCBs. The use of conductive pads 14a and 14b allow further routing options for input/output of these signals. This provides another option for signal isolation, improving the handling of EMI generation due to signal crosstalk.

Conductive pads 14a and 14b may be made out of any conductive material. For example, conductive pads 14a and 14b may be copper with a nickel alloy plating. Conductive pads 14a and 14b do not need to all be made of the same material. Different conductors may be selected based upon the needs of the system, for example.

PCBs 12a and 12b may be included in a power distribution system on an aircraft, for example. In this power distribution example, several PCBs, including PCBs 12a and 12b, may be installed within a power distribution box (not shown). PCBs 12a and 12b may be configured to receive, monitor, and distribute aircraft power. In prior art power distribution systems, all signals from PCBs 12a and 12b had to be routed through connectors 16a and 16b. PCBs 12a and 12b may include hundreds of components and require a large number of input/output (TO) signals. With all IO signals routed through connectors 16a and 16b, complexity was high, and preventing electromagnetic interference (EMI) due to signal crosstalk was difficult.

Conductive pads 14a and 14b may be arranged in a desired pattern at edges 18a and 18b of PCBs 22a and 22b. As seen in FIG. 1, conductive pads 14a are arranged in a different pattern than conductive pads 14b. This allows unique identification of PCBs 14a and 14b. In many systems, including aircraft power distribution systems, several PCBs may be installed in a single box or other assembly. The PCBs may look similar, requiring verification that the proper PCB is installed in the proper slot. In prior art systems, this was accomplished using connector keying aids, for example. By using unique patterns of conductive pads 14a and 14b, identification of proper PCBs 12a and 12b may be accomplished without the need for keying aids.

Figure 2:
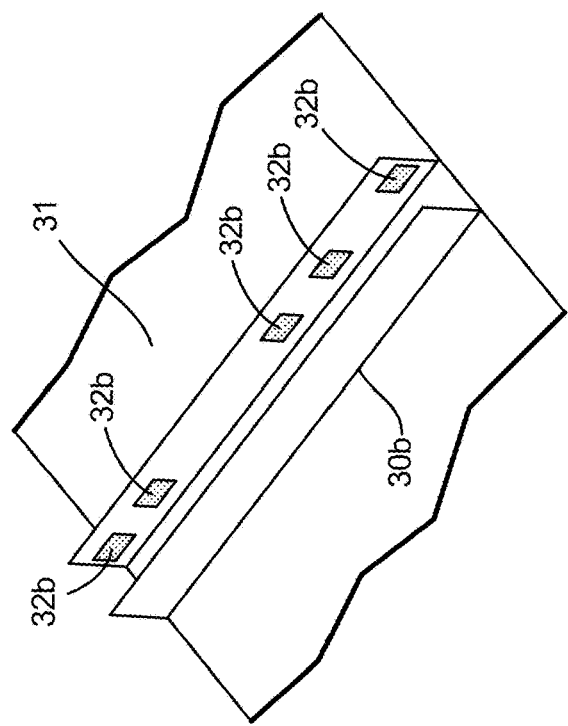
FIG. 2 is a diagram illustrating card guides configured to receive printed circuit boards.
Figure 2:
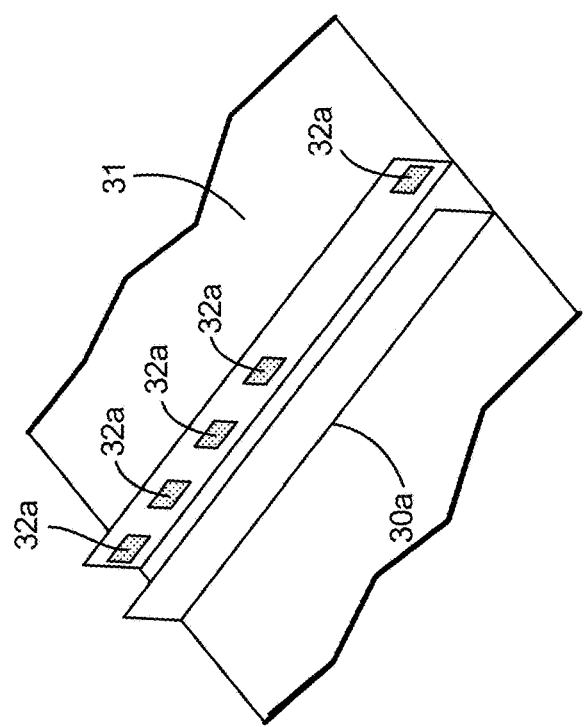

FIG. 2 is a diagram illustrating card guides 30a and 30b connected to assembly 31 and configured to receive respective PCBs 12a and 12b (FIG. 1). Card guide 30a includes conductive pads 32a and card guide 30b includes conductive pads 32b. As discussed above with respect to FIG. 1, conductive pads 14a are arranged in a first pattern on PCB 12a, while conductive pads 14b are arranged in a second pattern, different from the first pattern, on PCB 12b. Conductive pads 32a of card guide 30a are also arranged in the first pattern (i.e., corresponding to the arrangement of conductive pads 14a on PCB 12a), and conductive pads 32b of card guide 30b are arranged in the second pattern (i.e., corresponding to the arrangement of conductive pads 14b on PCB 12b). This way, the pattern of conductive pads of a PCB may be utilized to ensure that a respective PCB is installed in a correct location.

Card guides 30a and 30b may be integral to, or connected to, assembly 31, which may be a box or other stationary assembly configured to receive PCBs 12a and 12b. In the aircraft power distribution example, assembly 31 may be a power distribution box or cabinet. While illustrated as a "U" shape, card guides 30a and 30b may have any shape that facilitates the holding and securing of PCBs 12a and 12b, while also allowing mating between conductive pads 32a and 32b of card guides 30a and 30b, and respective conductive pads 14a and 14b of respective PCBs 12a and 12b.

In prior art systems, PCBs had to be blind mated to various connectors. This required guide pins to aid in alignment of the PCB and also required tolerancing to ensure proper mating with the connectors. Use of conductive pads 14a, 14b, 32a, and 32b eliminates the need for guide pins and tolerancing. Each card guide 30a and 30b may include a specific pattern of conductive pads 32a and 32b such that only the proper PCB 12a and 12b may work with (i.e., mate with) the respective card guide 30a and 30b. Then, proper communication of signals from PCB 12a through card guide 30a, for example, may be used to ensure proper installation of PCB 12a.

For example, a computer or other electronics (not shown) connected to the system that includes PCBs 12a and 12b may be configured to provide signals to, and receive signals from, PCBs 12a and 12b through respective card guides 30a and 30b. Following physical installation of PCBs 12a and 12b into card guides 30a and 30b, the connected computer may run an "installation test" to verify that each conductive pad 14a and 14b is properly mated to each conductive pad 32a and 32b, for example. The installation test can include, e.g., a test of successful signal routing between the computer or other electronics and PCBs 12a and 12b through the respective card guides 30a and 30b. A successful signal routing (i.e., signals successfully transmitted between PCBs 12a and 12b and the computer or other electronics connected to the system) can indicate a proper installation of PCBs 12a and 12b within respective card guides 30a and 30b. An unsuccessful signal routing (i.e., signals unsuccessfully transmitted between PCBs 12a and 12b and the computer or other electronics) can indicate an improper installation of PCBs 12a and 12b within respective card guides 30a and 30b, such as a mismatch between the corresponding one of PCBs 12a and 12b and the respective one of card guides 30a and 30b.

Conductive pads 32a and 32b may extend through respective card guides 30a and 30b, for example. This allows signals to be routed (not shown) along the back side of card guides 30a and 30b (i.e., the side of card guides 30a and 30b facing away from respective PCBs 12a and 12b.). These signals may be routed, for example, to other card guides, PCBs, or other external systems.

Figure 3:
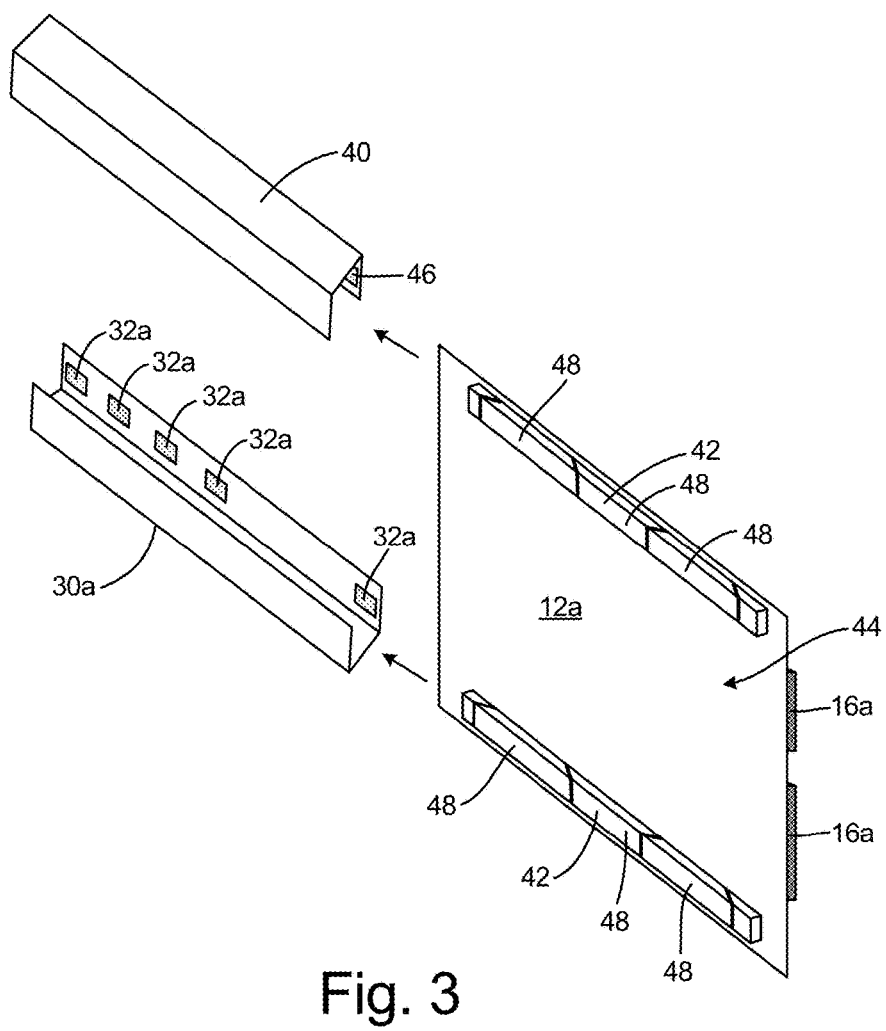
FIG. 3 is a diagram illustrating a printed circuit board and respective card guides.
Figure 4:
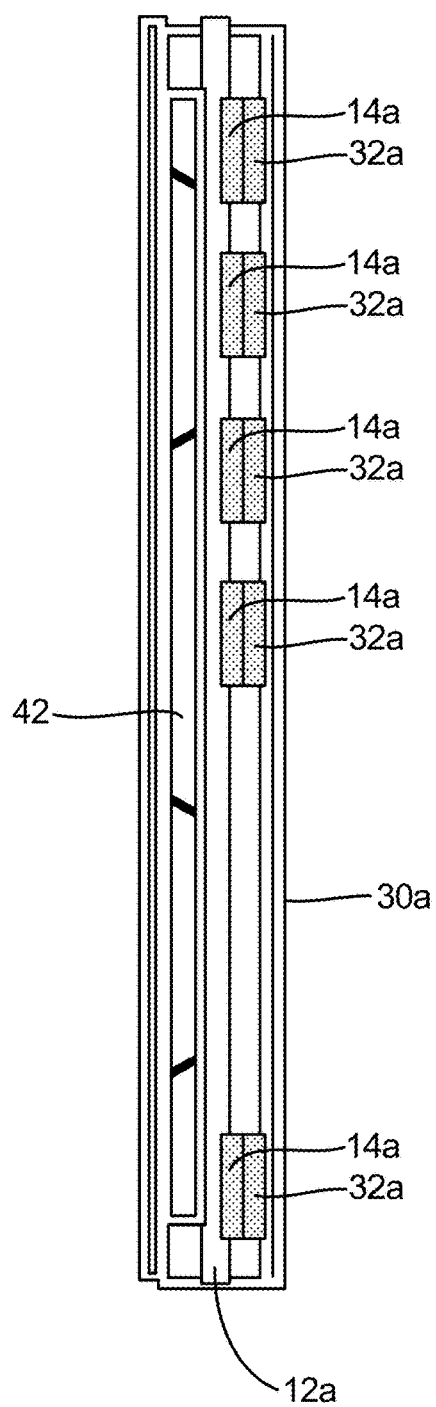
FIG. 4 is a cross-sectional view illustrating a printed circuit board mated with a card guide.

FIG. 3 is a diagram illustrating PCB 12a and respective card guides 30a and 40. FIG. 4 is a cross-sectional view illustrating PCB 12a mated with card guide 30a. Card guide 40 includes conductive pads 46 for signal communication with conductive pads 14a on PCB 12a. PCB 12a includes wedge locks 42 configured to mate with card guides 30a and 40 to lock PCB 12a in place. Systems, such as aircraft systems, may experience severe vibration or other forces during operation. It is desirable to lock PCB 12a in place such that there is no slack where vibration or other shock may cause or increase damage to PCB 12a.

Wedge locks 42 may be implemented on side 44 of PCB 12a, which is opposite that of side 22a (shown in FIG. 1). This way, when PCB 12a is installed in card guides 30a and 40, as illustrated by the arrows in FIG. 3, wedge locks 42 provide a force to ensure solid connection between conductive pads 14a and conductive pads 32a and 46. As illustrated in FIG. 3, wedge locks 42 include tapered portions 48. When securing PCB 12a in place, tapered portions 48 may be axially compressed, resulting in displacement of "wedges" of wedge locks 42, which acts to lock PCB 12a in place. For example, when wedge locks 42 are axially compressed, some tapered portions 48 are displaced to provide a force against PCB 12a, while other tapered portions 48 are displaced perpendicular to PCB 12a to provide a force against card guide 30a to lock PCB 12a in place via frictional engagement.

While conductive pads 14a have the same pattern at PCB edge 18a as at PCB edge 20a, different patterns may be utilized. For example, card guides 30a and 40 may each have unique patterns of respective conductive pads 32a and 46. Thus, the conductive pads 14a proximate edge 18a will have the same pattern as conductive pads 32a, while the conductive pads 14a proximate edge 20a will have the same pattern as conductive pads 46. This may allow more flexibility when designing the system that includes PCBs 12a and 12b.

By utilizing conductive pads on PCBs, the number of signals that must be routed through PCB connectors is reduced, which reduces complexity in the system. Additionally, some signals may interfere with other signals, or may generate EMI and require shielding, for example. The use of conductive pads allows these signals to be routed away from other signals that are passed to the PCB connector, further reducing cost and complexity. Further, the conductive pads may be arranged in patterns unique to specific PCBs. This allows verification that each PCB is installed in the correct location. Verification of signal connection also allows verification that the PCB is correctly installed in its respective location.

Discussion of Possible Embodiments

The following are non-exclusive descriptions of possible embodiments of the present invention.

A system includes a first circuit board and a first card guide configured to receive the first circuit board. The first circuit board includes a plurality of first board conductive pads arranged in a first board pattern. The first card guide includes a plurality of first guide conductive pads arranged in a first guide pattern. The plurality of first board conductive pads and the plurality of first guide conductive pads mate to provide signal communication between the first circuit board and the first card guide.

The system of the preceding paragraph can optionally include, additionally and/or alternatively, any one or more of the following features, configurations and/or additional components:

The first board conductive pads can be located proximate a first end of the first side of the first circuit board. The first circuit board can include a plurality of second board conductive pads located proximate a second end opposite the first end of the first circuit board.

The first card guide is connected to an assembly, and the system can further include a second card guide connected to the assembly and configured to receive the first circuit board, wherein the second card guide includes a plurality of second guide conductive pads configured to mate with the plurality of second board conductive pads.

The plurality of first board conductive pads can be on a first side of the first circuit board. The first circuit board can include a second side, opposite the first side. A first wedge lock can be connected to the second side of the first circuit board. The first wedge lock can be configured to lock the first circuit board into the first card guide.

A second wedge lock can be connected to the second side of the first circuit board. The second wedge lock can be configured to lock the first circuit board into the second card guide.

The second board conductive pads can be arranged in the first pattern.

The system can further include a second circuit board that includes a plurality of second board conductive pads arranged in a second board pattern and a second card guide configured to receive the second circuit board. The second card guide can include a plurality of second guide conductive pads arranged in the second guide pattern. The plurality of second board conductive pads and the plurality of second guide conductive pads can mate to provide signal communication between the first circuit board and the first card guide.

The second board pattern can be different from the first board pattern.

A method includes installing a first circuit board into a first card guide. The first circuit board includes a plurality of first board conductive pads arranged in a first board pattern. The first card guide includes a plurality of first guide conductive pads arranged in a first guide pattern. The method further includes verifying proper installation of the first circuit board by verifying that the first board pattern matches the first guide pattern.

The method of the preceding paragraph can optionally include, additionally and/or alternatively, any one or more of the following features, configurations, operations and/or additional components:

Installing the first circuit board into the first card guide can include: mating the first board conductive pads with the first guide conductive pads; and locking the first circuit board into the first card guide using a first wedge lock. The first wedge lock can be on an opposite side of the first circuit board of the plurality of first board conductive pads.

The first board conductive pads can be located proximate a first end of the first side of the first circuit board. The first circuit board can include a plurality of second board conductive pads located proximate a second end opposite the first end of the first circuit board. The method can further include installing the first circuit board into a second card guide. The second card guide can include a plurality of second guide conductive pads.

Installing the first circuit board into the first card guide can include: mating the second board conductive pads with the second guide conductive pads; and locking the first circuit board into the second card guide using a second wedge lock.

Verifying proper installation of the first circuit board can include: communicating signals between the plurality of first board conductive pads and the plurality of first guide conductive pads; and verifying proper installation based on proper communication of the signals.

The method can further include installing a second first circuit board into a second card guide. The second circuit board can include a plurality of second board conductive pads arranged in a second board pattern. The second card guide can include a plurality of second guide conductive pads arranged in a second guide pattern. The method can further include verifying proper installation of the second circuit board by verifying that the second board pattern matches the second guide pattern.

The first board pattern can be different from the second board pattern.

A printed circuit board includes a plurality of board conductive pads arranged in a first pattern. The printed circuit board is configured to be received by a first card guide. The first card guide includes a plurality of first guide conductive pads arranged in the first pattern. The printed circuit board is configured to transmit and receive signals to and from the first card guide through the plurality of board conductive pads.

The printed circuit board of the preceding paragraph can optionally include, additionally and/or alternatively, any one or more of the following features, configurations and/or additional components:

The printed circuit board can further include a first wedge lock. The plurality of board conductive pads can be on a first side of the printed circuit board. The first wedge lock can be on a second side, opposite the first side, of the printed circuit board. The first wedge lock can be configured to lock the printed circuit board into the first card guide.

The plurality of board conductive pads can include a first set of board conductive pads located proximate a first edge of the printed circuit board, and a second set of board conductive pads located proximate a second edge, opposite the first edge, of the printed circuit board. The first set of board conductive pads can be arranged in a first edge pattern and configured to mate with the plurality of first guide conductive pads. The second set of board conductive pads can be arranged in a second edge pattern and configured to mate with a plurality of second guide conductive pads of a second card guide.

The first wedge lock can be located proximate the first edge of the printed circuit board. The printed circuit board can further include a second wedge lock on the second side of the printed circuit board and located proximate the second edge of the printed circuit board. The second wedge lock can be configured to lock the printed circuit board into the second card guide.

The printed circuit board further comprises at least one input output connector configured to transmit and receive signals to and from the printed circuit board.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An airplane power distribution system comprising:
    a first circuit board that includes a first circuit board input/output connector and a first plurality of first circuit board conductive pads arranged in a first circuit board pattern located proximate a first end of a first side of the first circuit board wherein the first circuit board is configured to communicate input/output signals through the first circuit board input/output connector and the first plurality of first circuit board conductive pads to reduce electromagnetic interference between input/output signals; and
    a first card guide configured to receive the first circuit board, wherein the first card guide configured to receive the first circuit board includes a plurality of first card guide conductive pads arranged in a first guide pattern, wherein the first plurality of first circuit board conductive pads and the plurality of first card guide conductive pads mate to provide signal communication between the first circuit board and the first card guide configured to receive the first circuit board.

2. The system of claim 1, wherein the first circuit board includes a second plurality of first circuit board conductive pads located proximate a second end opposite the first end of the first circuit board and wherein the first circuit board is further configured to communicate input/output signals through the first circuit board input/output connector, the first plurality of first circuit board conductive pads, and the second plurality of first circuit board conductive pads to reduce electromagnetic interference between input/output signals.

3. The system of claim 2, wherein the first card guide configured to receive the first circuit board is connected to an assembly, the system further comprising a second card guide connected to the assembly and configured to receive the first circuit board, wherein the second card guide configured to receive the first circuit board includes a plurality of second card guide conductive pads configured to mate with the second plurality of first circuit board conductive pads.

4. The system of claim 3, wherein the first plurality of first circuit board conductive pads are on the first side of the first circuit board, and wherein the first circuit board includes a second side, opposite the first side, and wherein a first wedge lock is connected to the second side of the first circuit board, and wherein the first wedge lock is configured to lock the first circuit board into the first card guide configured to receive the first circuit board via frictional engagement.

5. The system of claim 4, wherein a second wedge lock is connected to the second side of the first circuit board, and wherein the second wedge lock is configured to lock the first circuit board into the second card guide configured to receive the first circuit board.

6. The system of claim 2, wherein the second plurality of first circuit board conductive pads are arranged in the first pattern.

7. The system of claim 1, further comprising:
    a second circuit board that includes a second circuit board input/output connector and a first plurality of second circuit board conductive pads arranged in a second circuit board pattern located proximate a first end of a first side of the second circuit board wherein the second circuit board is configured to communicate input/output signals through the second circuit board input/output connector and the first plurality of second circuit board conductive pads to reduce electromagnetic interference between input/output signals; and
    a first card guide configured to receive the second circuit board, wherein the first card guide configured to receive the second circuit board includes a plurality of guide conductive pads arranged in a second guide pattern, wherein the first plurality of second board conductive pads and the plurality of guide conductive pads arranged in the second guide pattern mate to provide signal communication between the second circuit board and the first card guide configured to receive the second circuit board.

8. The system of claim 7, wherein the second circuit board pattern is different from the first circuit board pattern.

9. A method comprising:
    installing a first circuit board into a first card guide configured to receive the first circuit board, wherein the first circuit board includes a first circuit board input/output connector and a first plurality of first board conductive pads arranged in a first circuit board pattern, wherein the first circuit board is configured to communicate input/output signals through the first circuit board input/output connector and the first plurality of first circuit board conductive pads to reduce electromagnetic interference between input/output signals, and wherein the first card guide configured to receive the first circuit board includes a plurality of first card guide conductive pads arranged in a first card guide pattern; and
    verifying proper installation of the first circuit board by verifying that the first circuit board pattern matches the first card guide pattern.

10. The method of claim 9, wherein installing the first circuit board into the first card guide configured to receive the first circuit board comprises:
    mating the first plurality of first board conductive pads with the plurality of first card guide conductive pads; and
    locking, via frictional engagement, the first circuit board into the first card guide configured to receive the first circuit board using a first wedge lock, wherein the first wedge lock is on an opposite side of the first circuit board of the first plurality of first board conductive pads.

11. The method of claim 10, wherein the first plurality of first board conductive pads are located proximate a first end of the first side of the first circuit board, and wherein the first circuit board includes a second plurality of first board conductive pads located proximate a second end opposite the first end of the first circuit board, and wherein the method further comprises:

installing the first circuit board into a second card guide configured to receive the first circuit board, wherein the second card guide configured to receive the first circuit board includes a plurality of second card guide conductive pads.

12. The method of claim 11, wherein installing the first circuit board into the first card guide configured to receive the first circuit board comprises:

mating the second plurality of first circuit board conductive pads with the second card guide conductive pads; and locking the first circuit board into the second card guide configured to receive the first circuit board using a second wedge lock.

13. The method of claim 9, wherein verifying proper installation of the first circuit board comprises:

communicating signals between the first plurality of first board conductive pads and the first plurality of first guide conductive pads; and verifying proper installation based on proper communication of the signals.

14. The method of claim 9, further comprising:

installing a second circuit board into a card guide configured to receive the second circuit board, wherein the second circuit board includes a first plurality of second circuit board conductive pads arranged in a second circuit board pattern, and wherein the card guide configured to receive the second circuit board includes a plurality of card guide conductive pads arranged in a second card guide pattern; and verifying proper installation of the second circuit board by verifying that the second circuit board pattern matches the second card guide pattern.

15. The method of claim 14, wherein the first circuit board pattern is different from the second circuit board pattern.

16. A printed circuit board configured to be received by a first card guide, wherein the printed circuit board comprises:

a plurality of board conductive pads arranged in a first pattern, wherein the first card guide includes a plurality of first guide conductive pads arranged in the first pattern;

at least one input output connector configured to transmit and receive signals to and from the printed circuit board;

wherein the printed circuit board is configured to transmit and receive signals to and from the first card guide through the plurality of board conductive pads and the at least one input output connector to reduce electromagnetic interference between signals.

17. The printed circuit board of claim 16, further comprising:

a first wedge lock, wherein the plurality of board conductive pads are on a first side of the printed circuit board, and wherein the first wedge lock is on a second side, opposite the first side, of the printed circuit board, and wherein the first wedge lock is configured to lock the printed circuit board into the first card guide.

18. The printed circuit board of claim 17, wherein the plurality of board conductive pads comprise:

a first set of board conductive pads located proximate a first edge of the printed circuit board, wherein the first set of board conductive pads are arranged in a first edge pattern and are configured to mate with the plurality of first guide conductive pads; and a second set of board conductive pads located proximate a second edge, opposite the first edge, of the printed circuit board, wherein the second set of board conductive pads are arranged in a second edge pattern and are configured to mate with a plurality of second guide conductive pads of a second card guide.

19. The printed circuit board of claim 18, wherein the first wedge lock is located proximate the first edge of the printed circuit board, and wherein the printed circuit board further comprises a second wedge lock on the second side of the printed circuit board and located proximate the second edge of the printed circuit board, wherein the second wedge lock is configured to lock the printed circuit board into the second card guide.

\* \* \* \* \*